(12) United States Patent
Nakata

(10) Patent No.: US 6,970,486 B2
(45) Date of Patent: Nov. 29, 2005

(54) MOLD TYPE SEMICONDUCTOR LASER

(75) Inventor: Naotaro Nakata, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 531 days.

(21) Appl. No.: 09/858,508

(22) Filed: May 17, 2001

(65) Prior Publication Data

US 2002/0009112 A1 Jan. 24, 2002

(30) Foreign Application Priority Data

May 19, 2000 (JP) .................................... 2000-148673

(51) Int. Cl.$^7$ .............................................. H01S 3/04
(52) U.S. Cl. ........................................ 372/36; 372/34
(58) Field of Search ............................ 372/34, 75, 51, 372/54, 59, 55, 43–50, 36, 49; 349/42, 61; 362/31; 257/81; 136/244; 358/98; 369/110

(56) References Cited

U.S. PATENT DOCUMENTS

| | | | | |
|---|---|---|---|---|
| 4,918,521 A | * | 4/1990 | Yabe et al. | 358/98 |
| 5,065,390 A | * | 11/1991 | Miyauchi et al. | 369/110 |
| 5,307,362 A | * | 4/1994 | Tanaka et al. | 372/50 |
| 5,309,460 A | * | 5/1994 | Fujimaki et al. | 372/36 |
| 5,327,443 A | * | 7/1994 | Tanaka et al. | 372/36 |
| 5,350,917 A | * | 9/1994 | Taniguchi et al. | 250/216 |
| 5,485,479 A | * | 1/1996 | Kitamura et al. | 372/43 |
| 5,488,623 A | * | 1/1996 | Kitamura et al. | 372/36 |
| 5,617,439 A | * | 4/1997 | Kakimoto | 372/50 |
| 5,933,444 A | * | 8/1999 | Molva et al. | 372/75 |
| 6,191,833 B1 | * | 2/2001 | Hirakara | 349/61 |
| 6,219,113 B1 | * | 4/2001 | Takahara | 349/42 |
| 6,252,252 B1 | * | 6/2001 | Kunii et al. | 257/81 |
| 6,262,413 B1 | * | 7/2001 | Taniguchi et al. | 250/216 |
| 6,384,313 B2 | * | 5/2002 | Nakagawa et al. | 136/244 |
| 6,425,673 B1 | * | 7/2002 | Suga et al. | 362/31 |
| 6,459,711 B1 | * | 10/2002 | Hamaguchi et al. | 372/36 |

\* cited by examiner

Primary Examiner—Minsun Oh Harvey
Assistant Examiner—Tuan N. Nguyen
(74) Attorney, Agent, or Firm—Arent Fox PLLC

(57) ABSTRACT

A sub-mount (7) provided with a laser chip (8) and a light receiving element (5) for monitoring is bonded to a die pad portion (2a) of a first lead (2). An electrode of the laser chip and an electrode of the light receiving element are electrically connected to second leads (3, 4) by wires such as metallic wires, not shown, respectively. A resin frame (6) is provided to cover sides and a rear surface side of the sub-mount except for an emission surface side of the laser chip and to integrally hold one end portion sides of the first and second leads. An antireflection unit (9) for preventing light from being reflected on the light receiving element is formed on a portion of the resin frame opposite to the rear end face of the laser chip. As a result, it is possible to obtain a mold type semiconductor laser capable of constantly detect accurate laser chip output and capable of forming an accurate optical output control circuit.

7 Claims, 4 Drawing Sheets

FIG.3
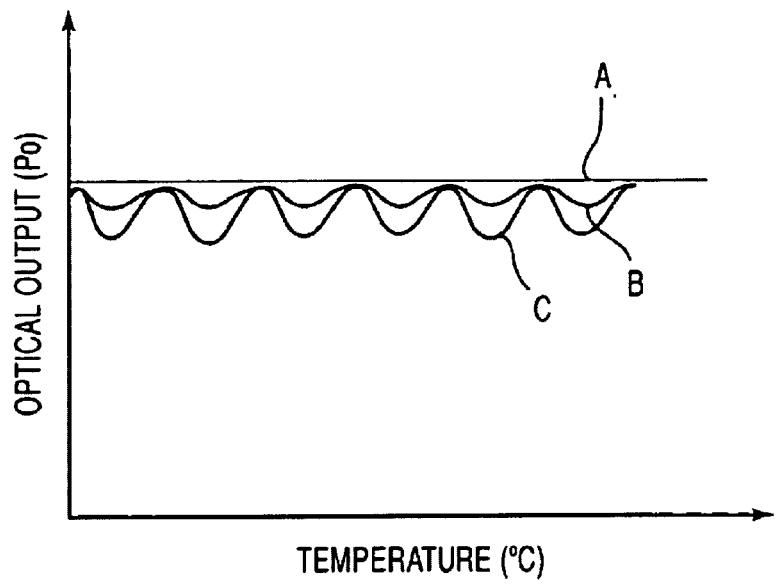
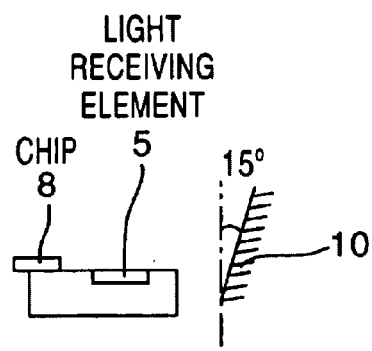
FIG.3A
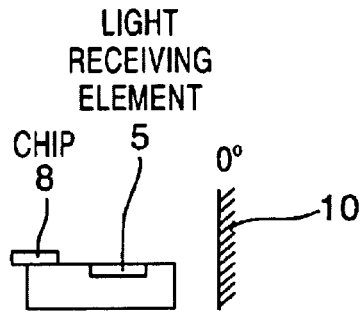
FIG.3B
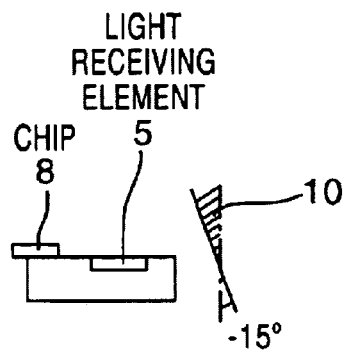
FIG.3C

MOLD TYPE SEMICONDUCTOR LASER

FIELD OF THE INVENTION

The present invention relates to a semiconductor laser particularly suited to be used as a pickup light source for a CD (compact disk), a DVD (digital versatile disk), an LBP (laser beam printer), a DVD-ROM or the like. More specifically, the present invention relates to a mold type semiconductor laser having a structure in which the influence of light reflection due to a resin-molded frame is eliminated while a laser chip is die-bonded to a lead frame and the resin-molded frame protects the periphery of the lead frame.

BACKGROUND OF THE INVENTION

A mold type semiconductor laser is disclosed by, for example, Japanese Patent No. 2951077 and constituted as shown in FIG. 5. In FIG. 5, a sub-mount 7 on which a laser (or LD) chip 8 is bonded is mounted on the die pad portion 2a on the tip end of a common lead 2 among three leads 2, 3 and 4 formed integrally as a lead frame 1. The LD chip 8 and a light receiving element 5 for monitoring are wire-bonded to the other leads 3 and 4 by wires which are not shown. Then, as shown in FIG. 5, a frame is molded by the synthetic resin, e.g., transfer-molded and formed on the periphery of the sub-mount 7 except for a beam emission side, whereby the leads 2, 3 and 4 are integrated with one another and fixed even if the leads 2 to 4 are separated from the lead frame 1.

The semiconductor laser of this type is adjusted together with, for example, the optical axis of a diffraction grating, a collimator lens, a finite objective lens or the like and thereby used as the light source of a pickup device or the like. In this case, as shown in FIG. 5, the sub-mount 7 is composed of a silicon substrate or the like and the light receiving element 5 is incorporated on the surface of the sub-mount 7 on a rear side thereof opposite to the emission surface of the LD chip 8. The output of the LD chip 8 is automatically controlled (APC) while monitoring the output, thereby detecting the pits of the compact disk or the like with constantly fixed output.

As stated above, if APC is conducted while monitoring the output of the laser chip using the light receiving element and the atmosphere temperature varies with temperature rise due to laser operation, then the output of light received by the light receiving element varies. It is detected that, for example, if the atmosphere temperature is changed while making laser output fixed, detection output is periodically changed. Due to this, it was discovered that even if the output of the laser chip actually has no change, the output detected by the light receiving element varies with temperature and that if the laser output is controlled based on the varying output, the laser output cannot be made fixed.

SUMMARY OF THE INVENTION

It is an object of the present invention to solve the above-stated problem and to provide a mold type semiconductor laser capable of forming an accurate optical output control circuit by constantly detecting accurate laser output and operable with constantly fixed output.

As described above, the inventor of the present invention discovered that unlike a can type (for mounting a laser chip on a stem and putting a cap over the laser chip), in a mold type semiconductor laser wherein a light receiving element is provided in rear of a laser chip, the output of the laser chip is automatically controlled by an automatic optical output control circuit for making the output of the laser chip fixed while monitoring the output of light beams emitted from the rear end face of the laser chip, the detection output of the light receiving element varies independently of the variation of the laser chip output. Further, after continuing dedicated studies to examine the cause, the inventor discovered that laser chip output regularly varies if the atmosphere temperature of the laser chip and the light receiving element portion is changed.

That is to say, as shown in FIG. 4, according to a conventional can-type semiconductor laser E, the detection output of a light receiving element is not changed and kept fixed even if the atmosphere temperature of the laser chip and the light receiving element portion is changed, while according to the above-stated conventional mold type semiconductor laser D, optical output periodically varies with temperature change. A further observation indicated that interference fringes are formed on the light receiving element, that the interference fringes vary depending on the temperature and that the interference fringes are formed by the interference between light beams emitted from the rear side of the laser chip and directly striking on the surface of the light receiving element and light beams reflected by a frame and striking on the surface of the light receiving element, which is emitted from the rear side of the laser chip. This is because if the atmosphere temperature varies, interference fringes are formed or not formed depending on the change of the oscillation wavelength of the laser chip and detection output thereby varies. Moreover, the inventor discovered that if the light beams reflected by a portion of the frame opposite to the rear end face of the laser chip is prevented from excessively returning to the surface of the light receiving element, the variation of the detection output can be eliminated.

According to the present invention, a mold type semiconductor laser comprises: a first lead having a die pad portion formed on one end; a laser chip and a light receiving element mounted on the die pad portion; second leads electrically connected to an electrode of the laser chip and an electrode of the light receiving element, respectively; and a resin frame covering sides and a rear end face side of the die pad portion except for an emission surface side of the laser chip, and integrally holding one end portion sides of the first and second leads, and characterized in that antireflection means for preventing light from being reflected on the light receiving element is formed on a portion of the resin frame opposite to the rear end face of the laser chip.

Here, the rear end face of the laser chip means an end face opposite to an emission surface on which light beams are emitted from the laser chip.

With this structure, it is possible to prevent the light beams emitted from the rear end face of the laser chip from being reflected by the resin frame and interfering with the directly incident light beams on the surface of the light receiving element, to receive only the light beams directly reaching to the light receiving element from the rear end face of the laser chip and to ensure detecting stable optical output. As a result, it is possible to accurately monitor the output of the laser chip and to automatically control optical output so as to compensate for the variation of the actual output of the laser chip.

The antireflection means is provided by forming an inclined surface on the portion of the resin frame opposite to the rear end face of the laser chip or by removing a part of the portion of the resin frame opposite to the rear end face of the laser chip.

BRIEF DESCRIPTION OF THE DRAWINGS

FIG. 3 is a view showing the variation of optical output according to temperature whose variation is detected by a light receiving element when a wall surface provided opposite to the rear end face of a laser chip is inclined;

DETAILED DESCRIPTION

Figure 1A:
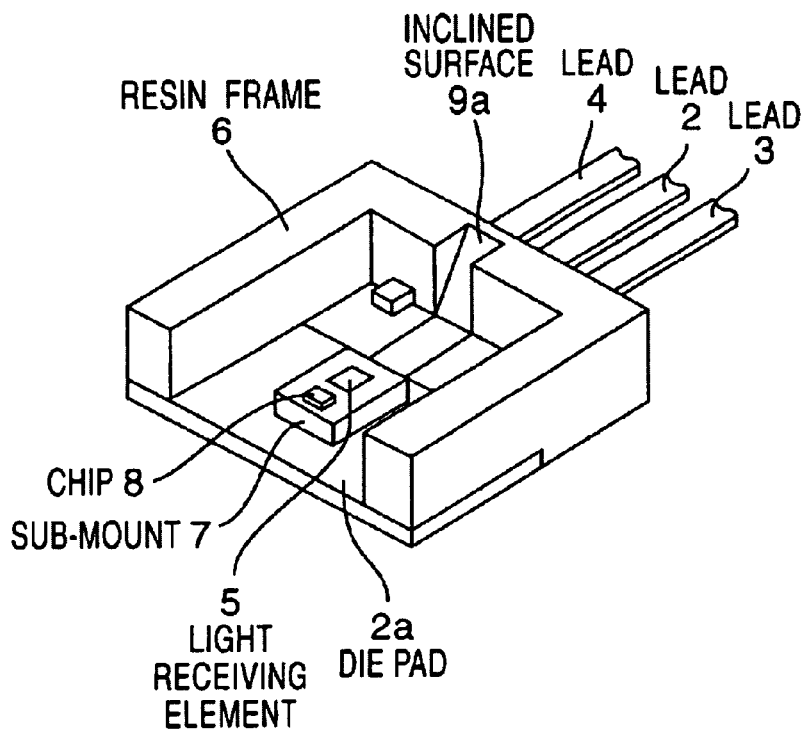
FIGS. 1(a) and 1(b) are explanatory views for one embodiment of a mold type semiconductor laser according to the present invention.
Figure 1B:
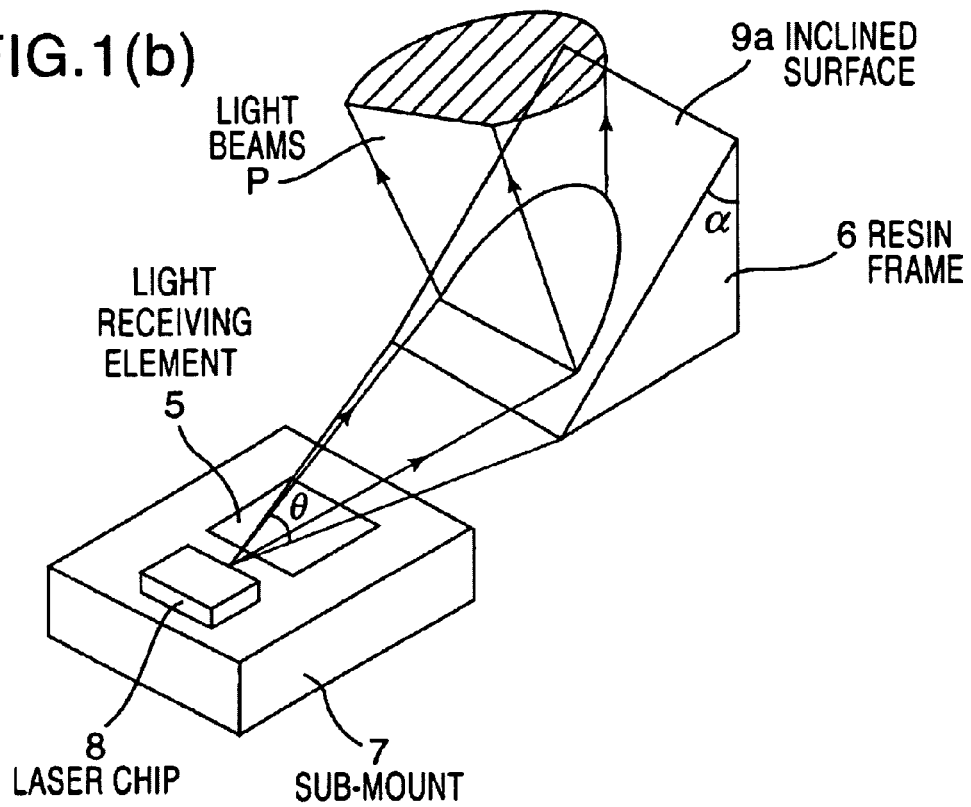

A mold type semiconductor laser according to the present invention has a sub-mount 7 which is mounted on a die pad portion 2a of the first lead (or a common lead) 2 having the die pad portion 2a formed on one end portion thereof, and on which a laser chip 8 and a monitoring light receiving element 5 are provided, as shown in FIGS. 1(a) and 1(b) which are explanatory views for one embodiment thereof. The electrode of the laser chip 8 and the electrode of the light receiving element 5 are electrically connected to the second leads 3 and 4 by wires such as metallic wires, not shown, respectively. A resin frame 6 is provided to cover the sides and a rear end side of the sub-mount 7 except for the emission surface side of the laser chip 8 and to integrally hold one end portion sides of the first and second leads 2, 3 and 4. An antireflection means 9 (9a) for preventing light from being reflected on the light receiving element 5 is formed on the portion of the resin frame 6 opposite to the rear end face of the laser chip 8.

As stated above, the inventor of the present invention discovered that in the mold type semiconductor laser wherein the silicon sub-mount 7 to which the laser chip 8 is bonded and on which the light receiving element 5 is formed, is mounted on the die pad portion 2a of the lead frame and the periphery of the sub-mount 7 is surrounded by the resin frame 6, interference fringes are formed on the light receiving element 5 by the reflection of light on the rear wall surface present in the rear side of the laser chip 8 and that even if there is no change in the output of the laser chip 8, detection output varies with temperature. Namely, if a wall surface is provided in rear of the laser chip 8 and inclined longitudinally with respect to a vertical surface, the rate of the change of detection output varies as shown in FIG. 3.

In FIG. 3, symbol A represents a case where the angle of the rear wall surface 10 with respect to the vertical surface is +15° (i.e., the rear wall surface 10 is inclined externally), B represents a case where the angle of the rear wall surface 10 is 0° (i.e., the rear wall surface 10 is vertical) and C represents a case where the angle of the rearwall surface 10 is −15° (i.e., the rearwall surface 10 is inclined internally). As is obvious from FIG. 3, if the rear wall surface 10 tends to have an internal inclination with which the reflection of light on the light receiving element 5 increases, output variation becomes quite large. On the other hand, if the rear wall surface 10 is inclined externally, the reflected light to the light receiving element 5 is quite little and detection output variation becomes, therefore, quite small. From this, it was discovered that the variation of the output detected by the light receiving element 5 can be suppressed by preventing light beams emitted from the rear end face of the laser chip 8 from being reflected to the light receiving element 5 side by the rear wall surface 10 opposite to the laser chip 8. The reason is considered as follows. The exposed surface of the resin frame 6 formed by transfer molding tends to reflect light since the surface of the frame 6 is formed into a smooth surface close to a mirror finished surface following the mirror finishing of the die for molding.

This reflection can be prevented by providing an inclined surface so as to reflect light externally as stated above. Besides, by removing a portion of the frame 6 to which a light beam is applied so as to allow light beams to go rearward, forming the surface of the portion of the frame 6 to which a light beam is applied into an irregular surface so as to irregularly reflect light beams, or applying an optical absorber to the surface thereof or the like, reflection can be prevented.

In the example shown in FIG. 1, the antireflection means 9 is provided by forming an inclined surface 9a on the inner wall of the frame 6 opposite to the rear end face of the laser chip 8. That is, as shown in FIG. 1(b) which is an enlarged explanatory view showing only the sub-mount 7 and a portion of the frame 6 on which the inclined surface 9a is formed, if the inclined surface 9a is provided, light beams P emitting from the rear end face of the laser chip 8 strike on the inclined surface 9a and are reflected upward to thereby make it possible to hardly return the light beams P to the light receiving element 5. Due to this, light beams directly incident from the laser chip 8 do not interfere with light beams reflected by the inner wall of the frame 6 and reaching the surface of the light receiving element 5, on the surface of the light receiving element 5.

The width of this inclined surface 9a is set according to the spread of the light beams P emitted from the laser chip 8 and the distance between the laser chip 8 and the frame 6. If the inclined surface 9a is formed in the range of ±15° from the central portion of the laser chip 8 (or light beam emission portion), i.e., in the range of θ=30°, then almost all light beams strike on the inclined surface 9a. It was also confirmed that if the angle α of the inclined surface 9a with respect to the vertical surface is not less than 10°, it is possible to prevent the light beams from being reflected by the light receiving element 5 almost completely.

The laser chip 8 is constituted out of, for example, a double hetero structure of AlGaAs or InGaAlP compound semiconductor, mounted on the sub-mount 7 made of silicon or the like and the silicon sub-mount 7 is mounted on the die pad portion 2a of the first lead 2 which is a common lead. As already stated above, the monitoring light receiving element 5 is formed on the sub-mount 7 so that the optical output of the laser chip 8 can be controlled automatically. One electrode of the laser chip 8 and one electrode of the light receiving element 8 are electrically connected to the first lead (or common lead) 2 by a bonding agent or the like while the other electrodes thereof are electrically connected to the second leads 3 and 4 by wires such as metallic wires, not shown, respectively.

The frame 6 is formed by being transfer-molded with an epoxy resin or the like to surround the periphery of the sub-mount 7 except for the emission surface side of the laser chip 8 so that the respective leads can be integrated with one another while the sub-mount is being mounted and so that the first lead 2 and the second leads 3 and 4 can be held even if disconnected from the lead frame. In the example shown in FIG. 1, no resin molding is provided on the upper and lower surface of the frame 6, the upper surface is opened and the die pad portion 2a is exposed on the lower surface. In addition, in the example shown in FIG. 1, as stated above, the inclined surface 9a is formed on a portion of the frame 6 opposite to the rear end face of the laser chip 8 and opposite to the emission surface side on which the frame 6 surrounding the periphery of the sub-mount is opened, thereby providing the antireflection means 9 for preventing light from being reflected to the light receiving element 5.

Figure 2A:
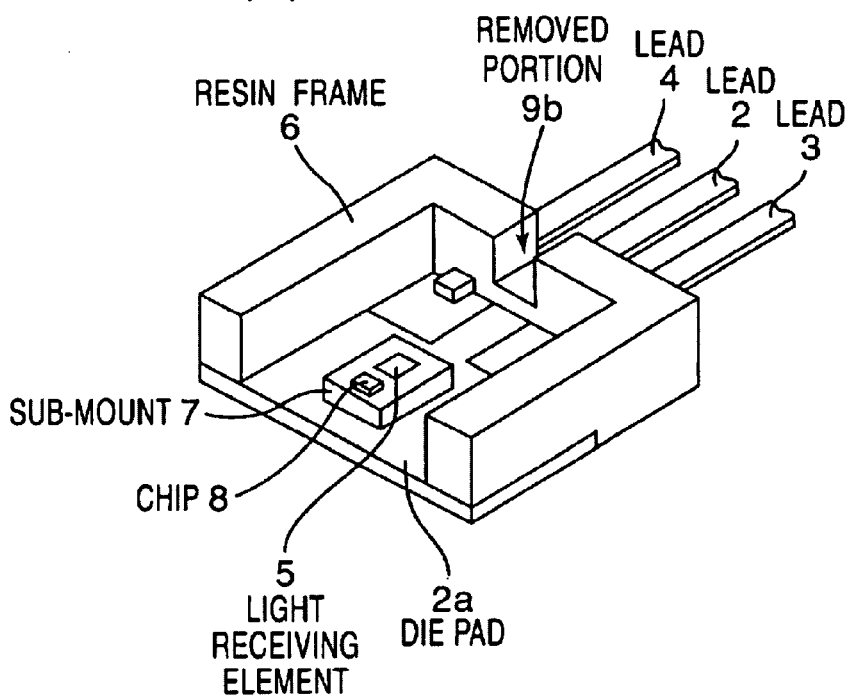
FIGS. 2(a) and 2(b) are explanatory views for another embodiment of a mold type semiconductor laser according to the present invention.
Figure 2B:
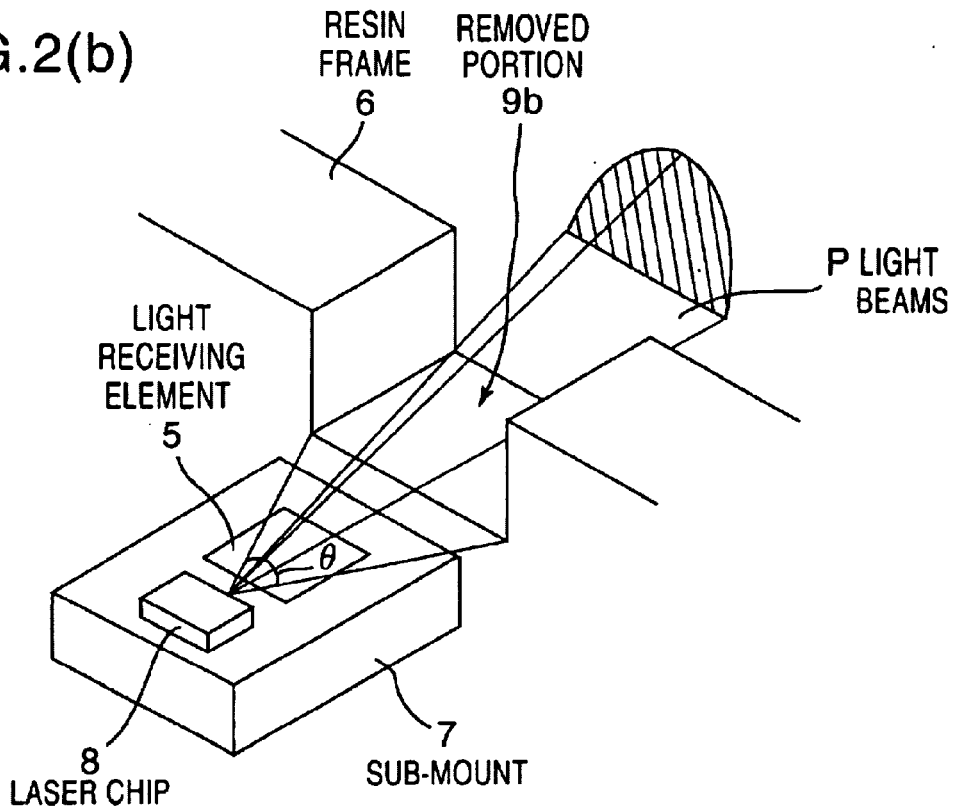
Figure 4:
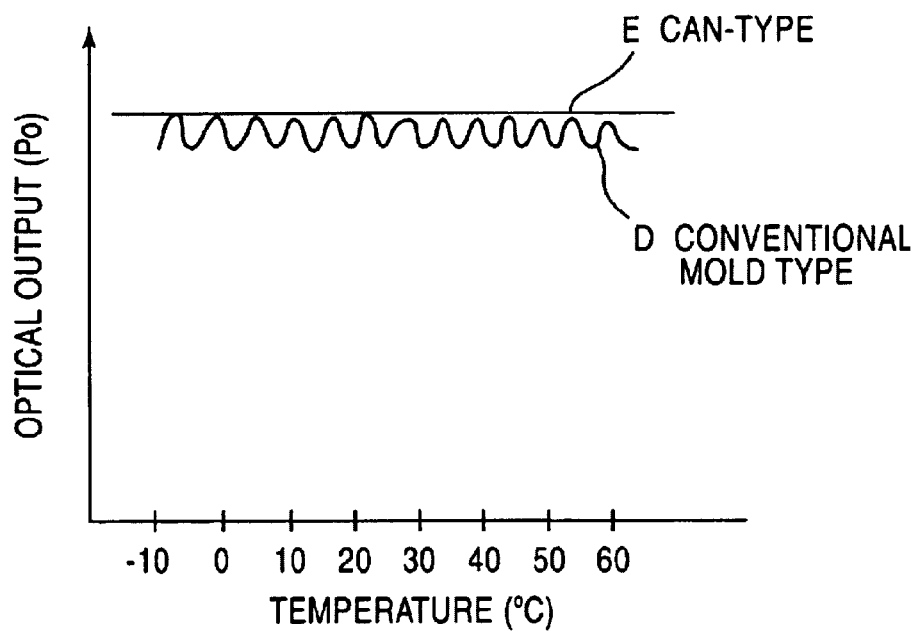
FIG. 4 is a view showing the variation of output caused by the light receiving element when temperature is changed in a conventional mold type semiconductor laser.
Figure 5:
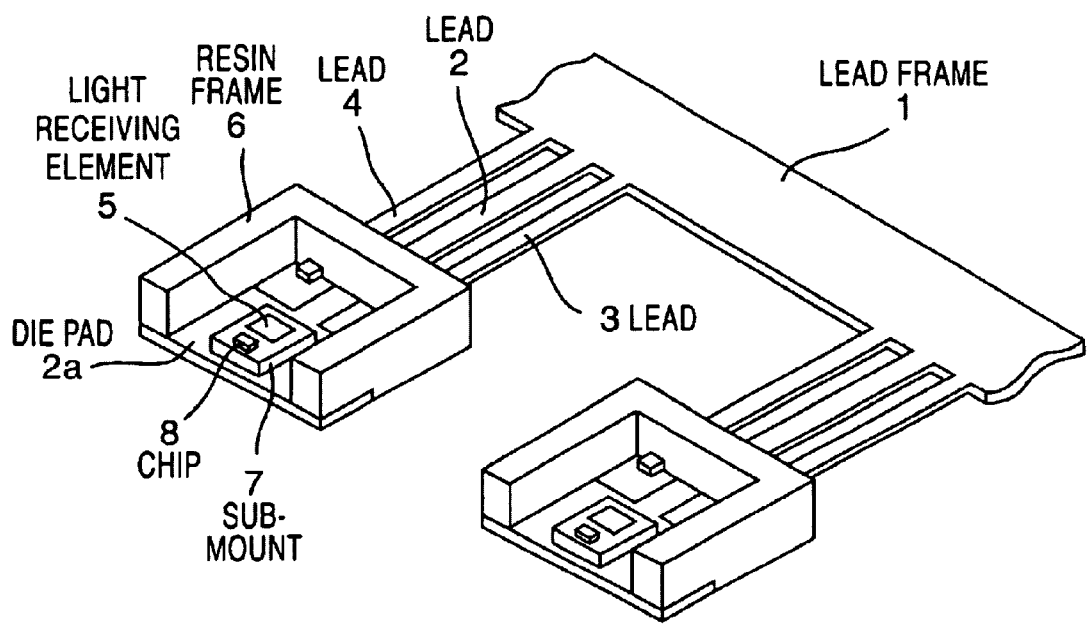
FIG. 5 is an explanatory view for an example of the structure of a conventional mold type semiconductor laser.

In the above-stated example, the antireflection means 9 for preventing light from being reflected to the light receiving element 5 is provided by forming the inclined surface 9a on a portion of the frame 6 opposite to the rear end face of the laser chip 8. Alternatively, as stated above, even if no inclined surface is provided, it suffices to provide a structure in which light beams are not reflected on the light receiving surface of the light receiving element 5. FIGS. 2(a) and 2(b) show a case where a portion of the frame 6 opposite to the rear end face of the laser chip 8 is removed.

In the example shown in FIG. 2 as in the case of FIG. 1, as shown in FIG. 2(b) which is an enlarged explanatory view showing only the sub-mount 7 and the removed portion 9b of the frame 9, by forming the removed portion 9b, light beams P emitting from the rear end face of the laser chip 8 pass through the removed portion 9b and go rearward to thereby make it possible to hardly return the light beams P to the light receiving element 5. Due to this, there occurs no interference between light beams directly incident from the laser chip 8 and light beams reflected by the inner wall of the frame 6 and reaching the surface of the light receiving element 5, on the surface of the light receiving element 5. If the removed portion 9b is formed in the range of ±15° from the central portion of the laser chip 8 (or laser beam emission portion), i.e., θ=30°, most of the light beams P pass through the removed portion 9b.

The antireflection means 9 is not necessarily formed by such an inclined surface or a removed portion. For example, if a rough surface having irregularity on the surface (i.e., an irregular surface) is formed, light is irregularly reflected. Even if some of the light beams return to the surface of the light receiving element 5, the variation of output with temperature change can greatly be reduced since the phases of the light beams are irregular and the light beams do not interfere with light beams directly entering the surface of the light receiving element 5 from the laser chip 8. It is also possible to prevent reflection by applying a light absorber such as black paint to the portion of the frame 6 and to thereby obtain the same effect as that stated above. Nevertheless, the structures shown in FIGS. 1 and 2 are preferable considering that the molding die is to be separated and a processing after molding is to be omitted. With these structures, it is possible to prevent the number of steps from increasing only by forming the molding die as shown in FIGS. 1(a) and 2(a).

In the mold type semiconductor laser according to the present invention, since the antireflection means for preventing light from being reflected to the light receiving element is provided on a portion of the frame opposite to the rear end face of the laser chip 8, light beams emitted from the rear end face of the laser chip are not reflected by the frame and not incident on the light receiving element to prevent the light beams from interfering with light beams directly incident on the light receiving element. As a result, even if the atmosphere temperature varies and oscillation wavelength varies with the temperature change, optical output to be detected does not periodically vary due to interference, whereby it is possible to accurately detect the optical output of the laser chip and to automatically, accurately control the optical output using the APC circuit.

As stated so far, according to the present invention, monitoring light beams do not interfere with light beams reflected by the frame even in the mold type semiconductor laser wherein the laser chip is bonded to the sub-mount on which the light receiving element is formed, the sub-mount is mounted on the die pad and the respective leads are fixed by the resin frame surrounding the sub-mount. Due to this, it is possible to quite accurately detect laser output using the light receiving element. As a result, it is possible to quite accurately control the laser output using the APC circuit and to finely reproduce the data in the medirm even with a highly fine DVD or the like.

Although preferred examples have been described in some detail it is to be understood that certain changes can be made by those skilled in the art without departing from the spirit and scope of the invention as defined by the appended claims.

What is claimed is:

1. A mold type semiconductor laser comprising:
    a first lead having a die pad portion formed on one end;
    a laser chip and a light receiving element for monitoring an output of said laser chip, mounted on the die pad portion;
    second leads electrically connected to an electrode of said laser chip and an electrode of said light receiving element, respectively;
    a resin frame covering sides and a rear end face side of said die pad portion except for an emission surface side of said laser chip, and integrally holding one end portion sides of said first and second leads; and
    an antireflection means for preventing a light emitted from a rear end face of said laser chip from being reflected and incident on said light receiving element, said antireflection means being formed on a portion of said resin frame opposite to the rear end face of said laser chip with respect to said light receiving element, wherein said antireflection means is formed by removing a portion of said resin frame opposite to the rear end face of said laser chip, so that the light emitted from the rear end face of said laser chip passes through the removed portion and goes rearward, and a light reflected by said resin frame is not incident on said light receiving element, such that said antireflection means is configured to prevent interference between the light incident on said light receiving element directly from the rear end face of said laser chip and a light reflected on said light receiving element.

2. A semiconductor laser according to claim 1, wherein said antireflection means is formed on said resin frame in a range of not less than ±15° in a horizontal direction from a light emission portion on the rear end face of said laser chip.

3. A mold type semiconductor laser comprising:
    a first lead having a die pad portion formed on one end;
    a laser chip and a light receiving element for monitoring an output of said laser chip, mounted on the die pad portion;
    second leads electrically connected to an electrode of said laser chip and an electrode of said light receiving element, respectively;
    a resin frame covering sides and a rear end face side of said die pad portion except for an emission surface side of said laser chip, and integrally holding one end portion sides of said first and second leads; and an antireflection means for preventing a light emitted from a rear end face of said laser chip from being reflected and incident on said light receiving element, said antireflection means being formed on a portion of said resin frame opposite to the rear end face of said laser chip with respect to said light receiving element, wherein said antireflection means is an irregular surface formed to allow the light to be irregularly reflected on the portion of said resin frame opposite to ihe rear end face of said laser chip so that a light reflected by said resin frame is not incident on said light receiving element, such that said antireflection means is configured to prevent interference between the light incident on said light receiving element directly from the rear end face of said laser chip and a light reflected on said light receiving element.

4. A semiconductor laser according to claim 3, wherein said antireflection means is a light absorber applied on the portion of said resin frame opposite to the rear end face of said laser chip.

5. A semiconductor laser according to claim 3, wherein said antireflection means is formed on said resin frame in a range of not less than ±15° in a horizontal direction from a light emission portion on the rear end face of said laser chip.

6. A mold type semiconductor laser comprising:

a first lead having a die pad portion formed on one end;

a laser chip and a light receiving element for monitoring an output of said laser chip, mounted on the die pad portion;

second leads electrically connected to an electrode of said laser chip and an electrode of said light receiving element, respectively;

a resin frame covering sides and a rear end face side of said die pad portion except for an emission surface side of said laser chip, and integrally holding one end portion sides of said first and second leads; and an antireflection means for preventing a light emitted from a rear end face of said laser chip from being reflected and incident on said light receiving element, said antireflection means being formed on a portion of said resin frame opposite to the rear end face of said laser chip with respect to said light receiving element, wherein said antireflection means is an inclined surface which has an angle of not less than 20° and less than 90° with respect to a vertical surface so that a light reflected by said resin frame is not incident on said light receiving element, such that said antireflection means is configured to prevent interference between the light incident on said light receiving element directly from the rear end face of said laser chip and a light reflected on said light receiving element.

7. A semiconductor laser according to claim 6, wherein said antireflection means is formed on said resin frame in a range of not less than ±15° in a horizontal direction from a light emission portion on the rear end face of said laser chip.

* * * * *